United States Patent [19]

Saw et al.

[11] Patent Number: 5,371,748
[45] Date of Patent: Dec. 6, 1994

[54] TECHNIQUE AND APPARATUS FOR TESTING AN ELECTRICALLY PROGRAMMABLE ROM EMBEDDED AMONG OTHER DIGITAL CIRCUITRY ON AN IC CHIP

[75] Inventors: Beng I. Saw; Marcus V. Tai; Dai M. Le, all of San Jose, Calif.

[73] Assignee: VLSI Technology, Inc., San Jose, Calif.

[21] Appl. No.: 37,957

[22] Filed: Mar. 26, 1993

[51] Int. Cl.⁵ .................. G06F 11/00; G06F 11/22; G11C 29/00
[52] U.S. Cl. ......................... 371/27; 364/579; 364/580; 371/21.1; 371/21.2; 371/22.6
[58] Field of Search ............... 324/73.1; 364/579, 580; 371/21.1, 21.2, 22.6, 24, 27

[56] References Cited

U.S. PATENT DOCUMENTS

| | | | |
|---|---|---|---|
| T930,005 | 1/1975 | Chia et al. | 371/27 X |
| 3,082,374 | 3/1963 | Buuck | 324/73.1 |
| 3,237,100 | 2/1966 | Chalfin et al. | 364/579 X |
| 3,492,872 | 1/1970 | Jones et al. | 371/27 |
| 3,714,403 | 1/1973 | Ammann et al. | 371/21.2 |
| 3,961,252 | 6/1976 | Eichelberger | 371/22.3 |
| 4,519,078 | 5/1985 | Komonytsky | 371/27 X |
| 4,559,626 | 12/1985 | Brown | 371/21.2 |

*Primary Examiner*—Edward R. Cosimano
*Attorney, Agent, or Firm*—Majestic, Parsons, Siebert & Hsue

[57] ABSTRACT

A method and apparatus for testing an electrically programmable read-only-memory which is embedded within logic or other digital circuitry on an integrated circuit is described. An integrated circuit tester is used to test the electrically programmable read-only-memory along with the logic or other digital circuitry by encoding certain test channels of the integrated circuit tester, and inputting the encoded test channels into a high voltage signal decoding circuit specially adapted to generating a high voltage, programming voltage required by the electrically programmable read-only-memory when the programming of certain test bits in the electrically programmable read-only-memory is conducted.

8 Claims, 3 Drawing Sheets

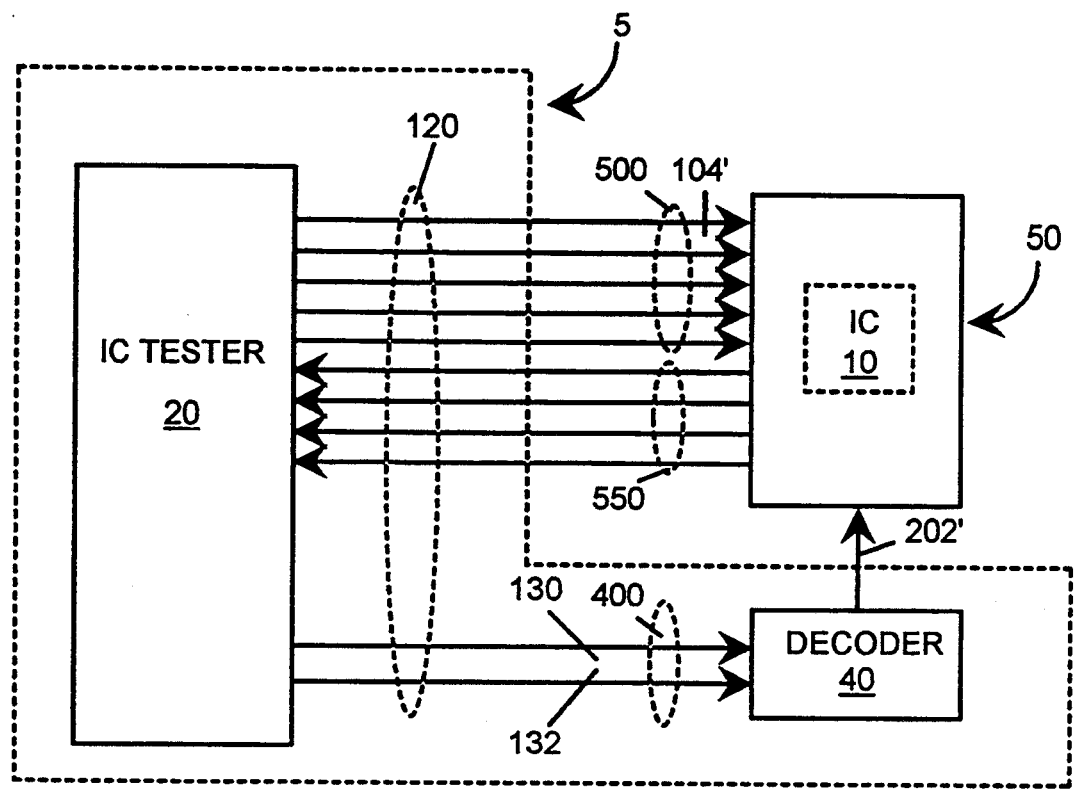
FIG.3
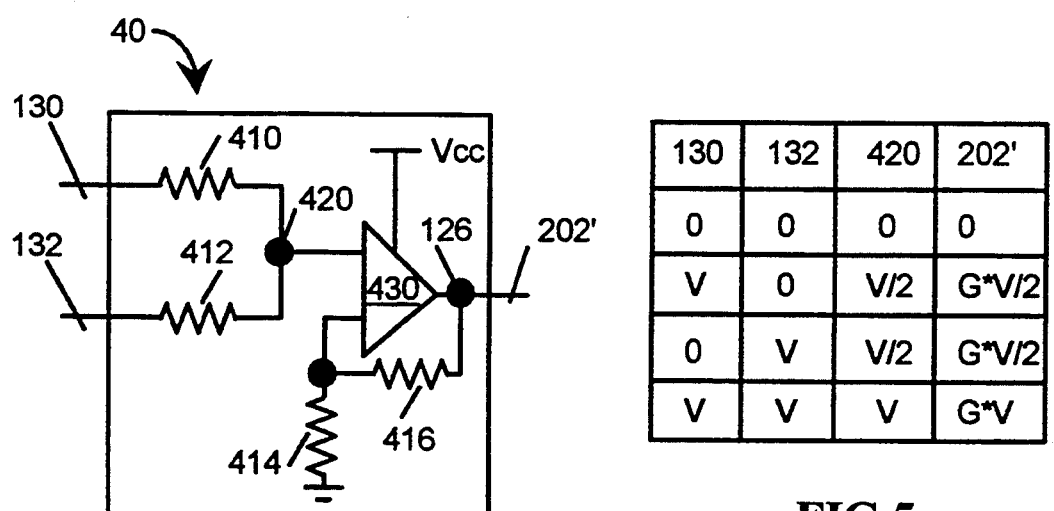
FIG.4
FIG.5

TECHNIQUE AND APPARATUS FOR TESTING AN ELECTRICALLY PROGRAMMABLE ROM EMBEDDED AMONG OTHER DIGITAL CIRCUITRY ON AN IC CHIP

BACKGROUND OF THE INVENTION

This invention relates in general to techniques for testing integrated circuit chips ("ICs") having an electrically programmable read-only-memory ("ROM") embedded within logic or other digital circuitry on the chip and in particular, to a technique and apparatus for programming and testing at least a portion of the embedded electrically programmable ROM concurrently with and using the same IC tester for functionally testing the logic or other digital circuitry on the chip.

If an electrically programmable ROM is embedded among logic or other digital circuitry on an IC, it is preferable for an IC tester which is functionally testing the logic and other digital circuitry on the IC, to also test at the same time at least a portion of the electrically programmable ROM. For one reason, access to the embedded ROM by sources external to the IC may be limited or restricted in some way, thus making testing of the embedded ROM difficult for a standard memory device tester. For example, since the primary purpose of the embedded ROM is generally to provide fixed data to the logic or other digital circuitry on the IC, parallel data access to sources external to the IC is not normally required. Therefore, only serial access might be provided to external sources to reduce pin-count on the packaged IC. In addition, special address coding and data storage schemes might be used to optimize the access and utilization of the embedded ROM by internal logic or digital circuitry on the IC. As a consequence, direct access to the embedded ROM from external sources may not be possible and indirect access may require the processing of external data requests to pass through special decoding logic on the IC.

Another reason why it is advantageous for the IC tester to test the electrically programmable ROM is that it can do this on a bit-by-bit basis. By having the IC tester test the electrically programmable ROM portion of the IC on a bit-by-bit basis by programming and then verifying the programming of each test bit before testing a next test bit in the electrically programmable ROM, testing of the ROM can be stopped immediately upon first detection of a failure. This ensures that additional programming and test time is not wasted on a "bad" part. In contrast, if the electrically programmable ROM is tested by first programming it on a separate programming device and then verifying the programmed device on a standard memory tester or the IC tester, all of the test bits must be programmed before any of the programmed test bits can be verified. This approach results in completely programming all of the test bits of a "bad" part and consequently, wasting programming time on the programming device. As an example, in some electrically programmable ROM technologies this programming time can be significant (e.g., on the order of $\approx 25.0$ msec. per bit, or $\approx 100$ seconds to program a 512 byte memory).

Having the IC tester both program and subsequently verify the programming of a test bit in the electrically programmable ROM presents a problem, however, because the typical programming voltage ($\approx 12.0$ to 18.0 volts) required to program an electrically programmable ROM is significantly higher than the typical HIGH and LOW logic level voltages ($\approx 5.0$ and 0.0 volts) required for reading the programmed electrically programmable ROM and functionally testing the logic or other digital circuitry on the IC.

If the IC tester has switchable alternate and primary reference voltage supplies ("$RVS_s$") available on each of its test channels, then one method of solving the high voltage problem is to set the primary $RVS_s$ on all of the test channels to a value suitable for testing the logic or other digital circuitry on the IC, and set the alternate $RVS_s$ on at least one of the test channels to the higher programming voltage required for programming the electrically programmable ROM. Thereafter, when data is to be read from the electrically programmable ROM or the logic or other digital circuitry on the IC is to be tested, the selected test channel having its alternate $RVS_s$ set to the higher programming voltage can be set to its primary $RVS_s$, and when the electrically programmable ROM is to be programmed, it can be switched to the alternate $RVS_s$.

Although this method can be used with a standard IC tester to program a test bit and subsequently verify the programmed test bit, switching between the primary and alternate $RVS_s$ cannot readily be done during functional testing of the IC. Consequently, functional testing must stop each time the reference voltage supply for a test channel is switched from the primary to the alternate $RVS_s$, and vice versa. When a large number of test bits are being programmed in this way, the turning off and on of functional testing and then, repeatedly switching between the primary and alternate $RVS_s$ can be time consuming and consequently, costly in terms of tester and/or operator time.

In addition to the problem of generating the required high programming voltage on the IC tester, another problem is generating a test program which commands the IC tester to generate the required high programming voltage during functional testing of the logic or other digital circuitry. Typically, the test program is at least partially software generated from data resulting from a computer simulation of the IC. Since generally the simulation program only simulates the functionality of the logic or other digital circuitry on the IC, only HIGH and LOW logic levels ("1's" and "0's") are simulated and consequently, only their corresponding voltage levels (e.g., $\approx 5.0$ and 0.0 volts) are programmed into the test program.

Therefore, to generate the programming voltage (e.g., $\approx 12.0$ to 18.0 volts) required to program an electrically programmable ROM embedded within the logic or other digital circuitry on the chip, the test program generated from the simulation data would generally be manually modified by a computer programmer to include additional steps, such as turning functional testing off and on, and switching the reference voltage supply between the primary and alternate $RVS_s$ back and forth on at least one selected test channel. When there are a large number of test bits to be programmed, such manual intervention can be not only time consuming, but also lead to error.

OBJECTS AND SUMMARY OF THE INVENTION

Accordingly, one object of the present invention is to provide a technique and corresponding apparatus for programming and testing at least a portion of an electrically programmable ROM embedded within logic or other digital circuitry of an IC without discontinuing functional testing of the IC and switching the reference voltage supply on one or more of the test channels of an IC tester between its primary and alternate reference voltage supplies.

Another object of the present invention is to provide a technique for generating a test program that is suitable for testing at least a portion of an electrically programmable ROM embedded within logic or other digital circuitry of an IC, directly from simulation data resulting from a simulation of the IC without requiring modification to do so by a computer programmer.

These and additional objects are accomplished by the various aspects of the present invention, wherein briefly stated, one aspect of the invention is a method for simulating an IC and generating a test program for testing the IC in an IC test apparatus. The IC test apparatus includes an IC tester having a plurality of test channels, and a decoder circuit having two inputs and an output. Each of the two decoder inputs is connected to one of the test channels of the IC tester. The IC includes logic circuitry, an electrically programmable read-only-memory embedded among the logic circuitry, a plurality of input and output pads responsive to HIGH and LOW logic level voltages, and a programming pad also responsive to HIGH and LOW logic level voltages as well as a third, higher level voltage (hereinafter referred to as "PROGRAMMING voltage") for programming the electrically programmable read-only-memory. Each of the input and output pads are internally connected to either the logic circuitry or the electrically programmable read-only-memory and externally connected to one of the test channels of the IC tester. Likewise, the programming pad is internally connected to the electrically programmable read-only-memory and externally connected to the output of the decoder circuit.

The method comprises the steps of: (a) selecting an encoding scheme for encoding the test channels connected to the at least two inputs to the decoder circuit, such that the output of the decoder circuit generates the PROGRAMMING voltage for programming the electrically programmable read-only-memory when programming of the read-only-memory is desired, generates the HIGH logic level voltage when reading of the read-only-memory is desired, and generates the LOW logic level voltage when neither programming or reading of the read-only-memory is desired; (b) generating simulated outputs corresponding to the test channels connected to the output pads of the integrated circuit by providing simulated inputs corresponding to the test channels connected to the input pads of the integrated circuit and simulated encoded inputs corresponding to the test channels connected to the at least two inputs of the decoding circuit, to a computer simulation of the integrated circuit and the decoding circuit; and (c) generating a test program for the integrated circuit tester from test vectors including the simulated inputs corresponding to the test channels connected to the input pads of the integrated circuit, the simulated encoded inputs corresponding to the test channels connected to the at least two inputs of the decoding circuit, and the simulated outputs corresponding to the test channels connected to the output pads of the integrated circuit and resulting from the computer simulation of the integrated circuit and the decoding circuit.

Another aspect of the present invention is a method for testing an IC having logic circuitry and an unprogrammed, electrically programmable read-only-memory by an IC tester, wherein the logic circuitry and the electrically programmable read-only-memory of the IC are responsive to HIGH and LOW logic level voltages, but the electrically programmable read-only-memory requires a third, higher level voltage (hereinafter referred to as "PROGRAMMING voltage") for programming the read-only-memory; the electrically programmable read-only-memory has a plurality of addresses; and the IC tester has a plurality of test channels, each test channel configured to drive the HIGH and LOW logic level voltages, but not the PROGRAMMING voltage for programming the electrically programmable read-only-memory.

The method comprises the steps of: (a) selecting one of the plurality of addresses of the electrically programmable read-only-memory for programming; (b) providing data to be programmed into the selected address of the electrically programmable read-only-memory; (c) causing a HIGH logic level voltage to be transmitted through a first test channel of the integrated circuit tester; (d) causing a HIGH logic level voltage to be transmitted through a second test channel of the integrated circuit tester; (e) receiving the HIGH logic level voltages from the first and second test channels of the integrated circuit tester and generating a first voltage signal equal in amplitude to the HIGH logic level voltage in response thereof; (f) amplifying the first voltage signal by a gain to generate a first amplified voltage signal equal in amplitude to the PROGRAMMING voltage for programming the read-only-memory; and (g) driving an input to the electrically programmable read-only-memory with the first amplified voltage signal to cause the selected address to be programmed with the provided data.

Another aspect of the present invention is an IC test apparatus for testing an IC having logic circuitry and an unprogrammed, electrically programmable read-only-memory, wherein the IC has a plurality of inputs and outputs including an input for programming the electrically programmable read-only-memory. The IC test apparatus comprises an IC tester having a plurality of test channels, and a high voltage signal decoding circuit for receiving two of the test channels and generating a signal in response thereof to drive the input for programming the electrically programmable read-only-memory.

The high voltage signal decoding circuit comprises: a resistor network including at least two resistors connected in series, the resistor network having two end nodes and an intermediate node, the intermediate node being situated between at least two resistors, the first test channel being connected to one of the two end nodes and the second test channel being connected to the other of the two end nodes; and a voltage amplifier having an input connected to the intermediate node of said resistor network, and an output; wherein the output of the voltage amplifier is connected to and drives the programming input of the IC.

A test program causes the IC tester to provide a HIGH logic level voltage on each of the two test channels received by the high voltage signal decoding circuit when the signal driving the input for programming the electrically programmable read-only-memory is to be equal to a programming voltage, causes the integrated circuit tester to provide a voltage signal corresponding to the HIGH logic level voltage on one of the two test channels and a LOW logic level voltage on the other when the signal driving the input for programming the electrically programmable read-only-memory is to be equal to the HIGH logic level voltage, and causes the IC tester to provide a voltage signal corresponding to the LOW logic level voltage on each of the two test channels when the signal driving the input for programming the electrically programmable read-only-memory is to be equal to the LOW logic level voltage.

Additional objects, features and advantages of the various aspects of the present invention will become apparent from the following description of its preferred embodiment, which description should be taken in conjunction with the accompanying drawings.

BRIEF DESCRIPTION OF THE DRAWINGS

FIG. 3 illustrates an example of a test apparatus, utilizing aspects of the present invention, for testing the integrated circuit of FIG. 1;

FIG. 4 illustrates an example of a high-voltage signal decoding circuit, utilizing aspects of the present invention, for receiving encoded signals on preselected test channels of the integrated circuit tester and generating a high voltage programming signal in response thereof;

FIG. 5 illustrates an example of an encoding scheme, utilizing aspects of the present invention;

DETAILED DESCRIPTION OF THE PREFERRED EMBODIMENT

Figure 1:
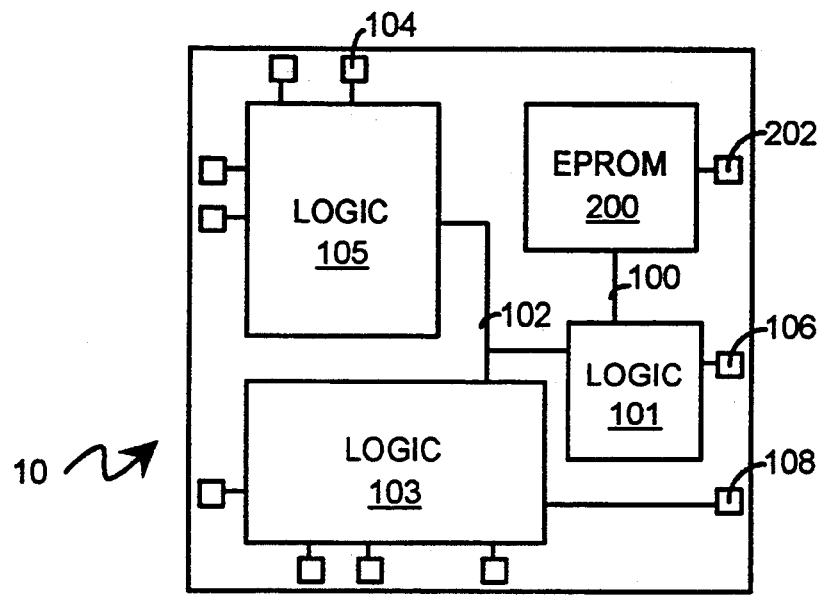
FIG. 1 illustrates a simplified example of an integrated circuit having an electrically programmable read-only-memory embedded among logic circuitry on the chip.

FIG. 1 illustrates a simplified lay-out of an integrated circuit chip 10 ("IC") having an electrically programmable read-only-memory 200 ("ROM") embedded within blocks of logic or other digital circuitry, e.g., 101, 103 and 105 (hereinafter cumulatively referred to as "logic circuitry" or "logic blocks"). For purposes of the present invention, there are no restrictions on the functionality of the logic blocks as long as they respond to standard HIGH and LOW logic level voltages (e.g., $\approx 5.0$ and 0.0 volts, respectively). For example, in one configuration, logic block 101 might be a shift register, logic block 103 might be "glue" logic, and logic block 105 might be a microprocessor.

Internal communication between the logic blocks is facilitated through lines 102, and between logic block 101 and the electrically programmable ROM 200 through lines 100. External communication between the IC 10 and other components in a system in which the IC 10 is a part, is facilitated by input/output ("I/O") pads, e.g., 104, 106, 108, which receive/transmit standard HIGH and LOW logic level voltage signals. At least one programming pad 202 is provided as a high voltage input into the electrically programmable ROM 200 to facilitate programming of the ROM 200. Typically, this programming voltage is substantially higher (e.g., $\approx 12.0$ to 18.0 volts) than the standard HIGH and LOW logic level voltages (e.g., $\approx 5.0$ and 0.0 volts, respectively) being transmitted through the other I/O pads (e.g., 104, 106, and 108) of the IC 10. Other pads used for such purposes as providing power and ground source connections, are not shown in the figure in order to simplify the description.

Several process technologies are available for forming the electrically programmable read-only-memory. As an example, one process is the ViaLink ™ process which incorporates an anti-fuse technology jointly developed between QuickLogic, Inc. and VLSI Technology, Inc. This process utilizes amorphous silicon as a high resistance layer between two metal layers. By applying a programming voltage of approximately 13.0 volts for 25.0 msec. across the metal layers, a conductive path is formed through the amorphous silicon.

Figure 2:
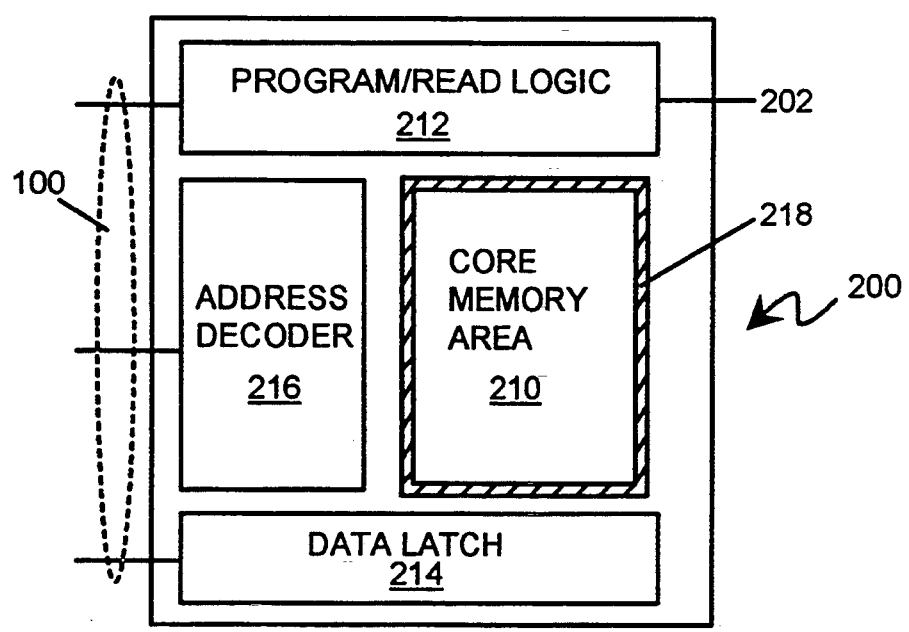
FIG. 2 illustrates, as an example, a simplified floor-plan for an electrically programmable read-only-memory such as that shown in FIG. 1.

FIG. 2 illustrates, as an example, a simplified floor-plan for the electrically programmable ROM 200. Address information is transmitted to address decoder 216, data is transmitted/received through data latches 214, and control signals are transmitted to programming/reading logic 212 over lines 100 (only representative lines shown). The high voltage input 202 is also connected to programming/reading logic 212. The address decoder 216, the data latches 214 and the programming/reading logic 212 are all connected to a core memory area 210 through internal connections (not shown).

The heart of the electrically programmable ROM 200 is the core memory area 210. Since the ViaLink ™ process is a one-time-programmable ("OTP") process, a plurality of dedicated test bits is provided and shown for example, in a predefined periphery area 218 (hatched area) of the core memory area 210. The manufacturer of IC 10 uses these test bits to verify proper fabrication of the electrically programmable read-only-memory 200. Since these test bits are programmed by the manufacturer of IC 10 prior to shipment of the IC 10 to its customer (typically an original equipment manufacturer or "OEM"), the test bits are not available for programming by the customer. The unshaded portion of the core memory 210, however, is available for programming by the customer. For non-OTP processes, for example, an electrically erasable programmable read-only-memory ("EEPROM") process, the provision of dedicated test bits is unnecessary since in those cases, portions of the core memory can be programmed for testing purposes and subsequently erased prior to shipment to the customer.

The IC 10 is then packaged so that each of the leads of the packaged IC is electrically connected to one of the pads of the IC 10. As shown in FIG. 3, the packaged IC 50 is then functionally tested by an IC tester 20 which is part of an IC test apparatus 5. The IC tester 20 has a plurality of test channels 120 which are each capable of sending and/or receiving standard HIGH and LOW logic level signals (e.g., $\approx 5.0$ and 0.0 volts).

Some of the plurality of test channels 120 stimulate the IC 10 (hereinafter referred to as "logic inputs" and shown in FIG. 3 as logic inputs 500), and some of the plurality of test channels 120 detect the results of such stimulation from the packaged IC 50 (hereinafter referred to as "logic outputs" and shown in FIG. 3 as logic outputs 550).

The IC tester 20 performs functional testing of the logic blocks (e.g., 101, 103 and 105 in FIG. 1) of the IC 10 by transmitting a predetermined sequence of bit patterns through the logic inputs 500 to the packaged IC 50, and detecting and comparing their resulting logic outputs 550 with expected output values (e.g., 550' in FIGS. 6 and 7) under the control of a test program (see, e.g., FIG. 7) which is running on and controlling the IC tester 20. Each bit pattern transmitted by the IC tester 20 indicates the HIGH or LOW logic level to be applied to each of the logic leads (e.g., 104' in FIG. 3) at a given point in time, and has a corresponding pattern of expected HIGH or LOW logic level outputs associated with it. The predetermined sequence of bit patterns and their expected outputs result from simulation data generated during a computer simulation of the IC 10 design.

Figure 6:
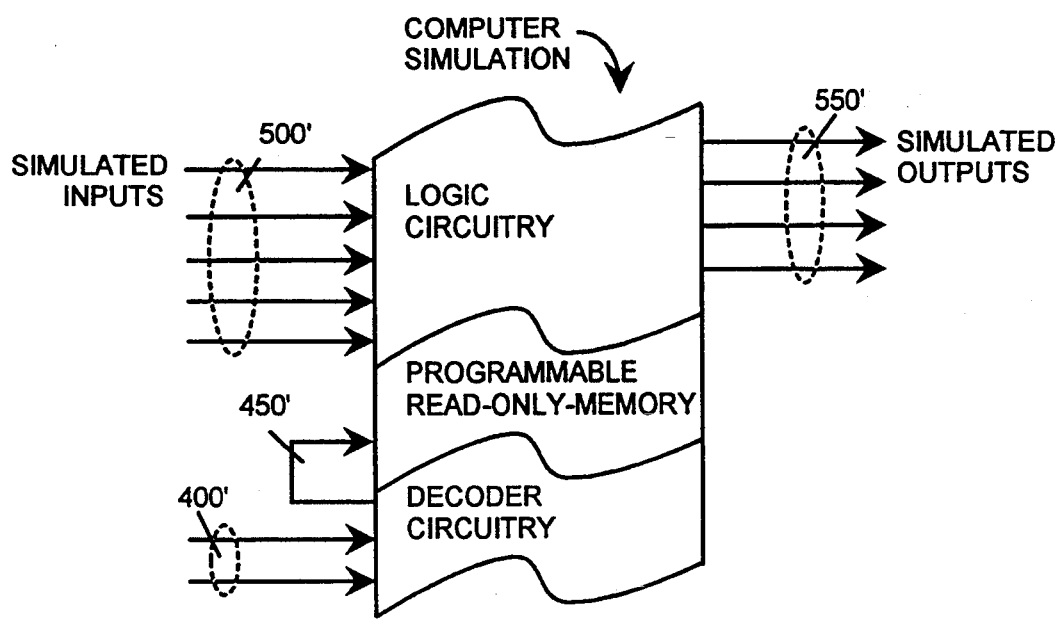
FIG. 6 serves to illustrate how expected output values corresponding to a set of input values provided to a logic device are generated by a computer simulation of the logic device by utilizing aspects of the present invention.
Figure 7:
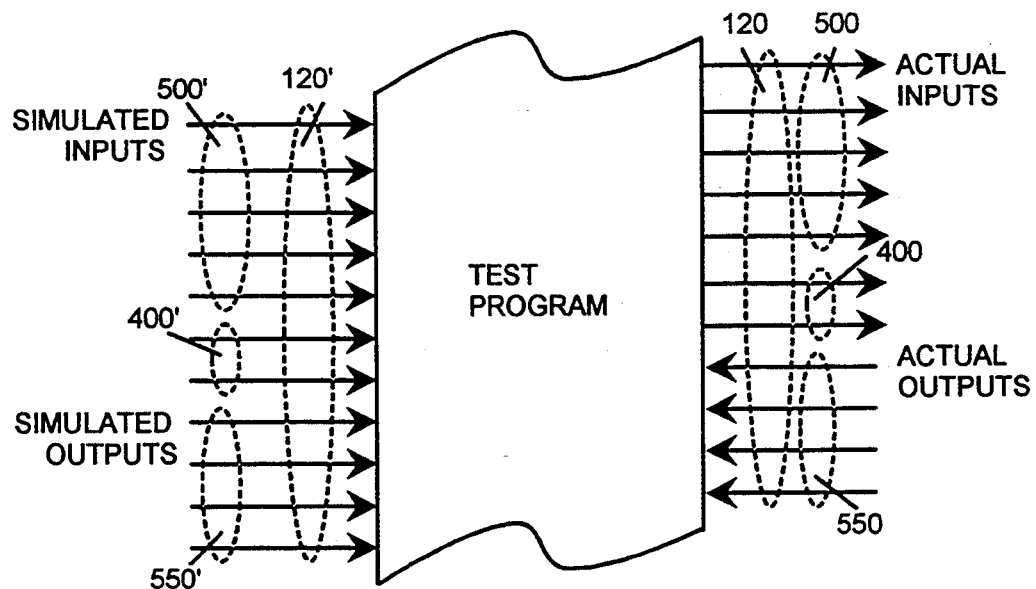
FIG. 7 serves to illustrate how the expected output values generated by the computer simulation of FIG. 6 are combined with their corresponding input values to form a test vector which is provided to a test program controlling a logic device tester for testing the logic device, so that the test program in turn causes the logic device tester to generate input signals to stimulate the logic device, receives output signals detected by the logic device tester from the logic device in response to those input signals, and then determines whether a logic device has failed or not by comparing the thus detected output signals to their corresponding expected output values.

Referring briefly to FIGS. 6 and 7, FIG. 6 illustrates how expected output values 550' (also referred to herein as "simulated outputs") are generated from a computer simulation program by providing as input data to the program, a set of simulated logic inputs 500' and a plurality of control bits 400'. The control bits 400' in conjunction with the decoder circuitry portion of the computer simulation program, indicates to the remainder of the computer simulation program (shown for illustration purposes by the arrow 450') whether data is to be read from or written to the electrically programmable read-only-memory portion of the computer simulation program.

FIG. 7 then serves to illustrate how the expected output values 550' generated by the computer simulation program as described in FIG. 6, are combined with their corresponding input values 500' and control bits 400' to form test vectors 120'. The test vectors 120' are then provided to and acted upon by a test program which controls the IC tester 20. The test program thereupon causes the IC tester 20 to generate input signals 500 to stimulate the IC 10, receives output signals 550 detected by the IC tester 20 from the IC 10 in response to those input signals 500, and compares the thus detected output signals 550 to their corresponding expected output values 550' to determine whether a logic failure has occurred or not. The test program also causes the IC tester 20 to generate control bits 400, wherein the unprimed signals 500, 550 and 400 respectively correspond to their primed signal counterparts 500', 550' and 400'.

In order to verify proper processing of the electrically programmable ROM portion (e.g., 200 in FIG. 1) of the IC 10, the IC tester 20 programs each of the test bits in a dedicated test bit area of the programmable ROM portion of the IC 10 (e.g., 218 in FIG. 2), and verifies the proper programming of that test bit before programming another test bit. By programming and immediately verifying the programming of each test bit in this one- at-a-time manner, subsequent testing of the electrically programmable ROM portion can be stopped upon the first detection of a test bit failure. Consequently, test time is not wasted by continuing to further test a "bad" part.

A high programming voltage ($\approx 12.0$ to 18.0 volts) which is required to program the test bits of the electrically programmable ROM, is generated by a high voltage signal decoding circuit 40 under the control of test channels 130 and 132 carrying control bits 400 from the IC tester 20. Since each of the plurality of test channels 120, including test channels 130 and 132, only send or receive voltage levels corresponding to the standard HIGH and LOW logic levels (e.g., $\approx 5.0$ and 0.0 volts, respectively), the bit patterns transmitted through test channels 130 and 132 are encoded such that they indicate to the high voltage signal decoding circuit 40 when a high programming voltage is to be generated or not generated.

FIG. 4 illustrates an example of a high voltage signal decoding circuit 40 for decoding the encoded signals from test channels 130 and 132, and generating or not generating the high programming voltage in response thereof. Test channels 130 and 132 are connected to opposite ends of a resistor network comprising two resistors, 410 and 412, connected in series. Node 420 is located between the two resistors, 410 and 412, and is connected to a positive input of a non-inverting amplifier 430 (such as an LM324). When the voltage levels on test channels 130 and 132 are the same, then the voltage level at node 420 is that same voltage level. For example, when both voltage levels on test channels 130 and 132 are HIGH logic level voltages, then the voltage level at node 420 is a HIGH logic level voltage. Conversely, when both voltage levels on test channels 130 and 132 are LOW logic level voltages, then the voltage level at node 420 is a LOW logic level voltage.

When the voltage levels on test channels 130 and 132 are different, however, the series resistors 410 and 412 act as a voltage divider network and the voltage level at node 420 is determined accordingly. For example, when the voltage level on test channel 130 is a HIGH logic level voltage and the voltage level on test channel 132 is a LOW logic level voltage, the voltage level at node 420 is equal to:

$$V_{420}=(V_H-V_L) * (R_{410}/(R_{410}+R_{412})) \qquad (1)$$

where:

$V_{420}$=Voltage at node 420;

$V_H$=HIGH logic level voltage;

$V_L$=LOW logic level voltage; and

R410 and R412=Resistances of resistors 410 and 412, respectively.

Conversely, when the voltage level on test channel 130 is a LOW logic level voltage and the voltage level on test channel 132 is a HIGH logic level voltage, the voltage level at node 420 is equal to:

$$V_{420}=(V_H-V_L) * (R_{412}/(R_{410}+R_{412})) \qquad (2)$$

A high voltage source Vcc, e.g., a 20.0 volt source, is also connected to the non-inverting amplifier 430, and a resistor feedback circuit comprising two resistors, 416 and 414, is connected to the negative input of the non-inverting amplifier 430. The voltage level on the output 126 of the high voltage signal decoding circuit 40 is then determined by the values of the feedback resistors, 416 and 414, respectively, which determine the closed loop feedback gain through the non-inverting amplifier 430.

$$G = (V_{126}/V_{420}) = 1 + (R_{416}/R_{414}) \qquad (3)$$

where:

$V_{126}$ = Voltage at output 126; and $R_{416}$ and $R_{414}$ = Resistances of resistors 416 and 414, respectively.

The output 126 is then connected to a programming pin 202' which is in turn, electrically connected to the programming pad 202 (FIG. 1) of the electrically programmable ROM 200 (FIG. 1).

FIG. 5 illustrates an example of an encoding/decoding scheme resulting from the circuit illustrated in FIG. 4, assuming that resistors 410 and 412 are of the same value. When both test channels 130 and 132 are at a LOW logic level (bit value of 0), the resulting output 126 of the non-inverting amplifier 430 is at a LOW logic level voltage (e.g., =0.0 volts) and consequently, the input to the programming pin 202' is the voltage level corresponding to the LOW logic level. The LOW logic level is the preferable value to be input to the programming pin 202' when neither programming or reading of the electrically programmable ROM 200 is being conducted.

Conversely, when both test channels 130 and 132 are at a HIGH logic level (bit value of 1), the resulting output 126 of the non-inverting amplifier 430 is raised to a voltage level equal to that of the HIGH logic level voltage (V) multiplied by the closed loop feedback gain (G) of the non-inverting amplifier 430. By proper selection of the gain of the non-inverting amplifier 430, the appropriate programming voltage for programming the electrically programmable ROM 200, can be generated. For example, if the voltage level corresponding to the HIGH logic level is 5.0 volts and the closed loop feedback gain (G) of the non-inverting amplifier 430 is 2.4, then a programming voltage of 12.0 volts results at output 126.

Finally, when either test channel 130 or 132 is at a HIGH logic level while the other is at a LOW logic level, the resulting output 126 of the non-inverting amplifier 430 is a voltage level equal to that the HIGH logic level voltage (V) multiplied by the closed loop feedback gain (G) of the non-inverting amplifier 430 and by the resistor ratio ($\frac{1}{2}$, where resistors 410 and 412 are equal) of the divider circuit formed by resistors 410 and 412 being connected in series with respect to the inputs connected to the test channels 130 and 132. By proper selection of the resistance values for resistors 410, 412, 416, and 414, the voltage level on the output 126 of the non-inverting amplifier 430 can be set to various values between that of the LOW logic level voltage and that of the voltage source $V_{cc}$, depending upon the logic level voltages transmitted through test channels 130 and 132. For example, $V_{126}$ can be set to the HIGH logic level voltage by selecting resistors 410, 412, 416 and 414 to be all equal in value. The HIGH logic level is the preferable value to be input to the programming pin 202' when data is to be read from the electrically programmable ROM 200.

Although the various aspects of the present invention have been described with respect to a preferred embodiment, it will be understood that the invention is entitled to full protection within the full scope of the appended claims. For example, other encoding schemes can also be readily used in conjunction with the various aspects of the present invention. Therefore, a first step in practicing certain aspects of the present invention is to select one of these various encoding schemes and develop appropriate decoding circuitry compatible with such selected scheme.

What is claimed is:

1. A method for simulating an integrated circuit and generating a test program for testing said integrated circuit in an integrated circuit test apparatus, wherein said integrated circuit test apparatus includes an integrated circuit tester having a plurality of test channels and a decoder circuit having two inputs and an output, each of said two inputs of said decoder circuit connected to one of said plurality of test channels of said integrated circuit tester, and said integrated circuit includes logic circuitry, an electrically programmable read-only-memory embedded among said logic circuitry, a plurality of input and output pads responsive to HIGH and LOW logic level voltages, and a programming pad responsive to said HIGH and LOW logic level voltages and a PROGRAMMING voltage for programming said electrically programmable read-only-memory, said input and output pads being electrically connected to said logic circuitry and said electrically programmable read-only-memory, each of said input and output pads being electrically connected to one of said plurality of test channels of said integrated circuit tester, said programming pad being electrically connected to said output of said decoder circuit, comprising the steps of:

(a) selecting an encoding scheme for encoding the test channels connected to said at least two inputs to said decoder circuit, such that said output of said decoder circuit generates said PROGRAMMING voltage for programming said electrically programmable read-only-memory when programming of said read-only-memory is desired, generates said HIGH logic level voltage when reading of said read-only-memory is desired, and generates said LOW logic level voltage when neither programming or reading of said read-only-memory is desired;

(b) generating simulated outputs corresponding to said test channels electrically connected to said output pads of said integrated circuit by providing simulated inputs corresponding to said test channels electrically connected to said input pads of said integrated circuit and simulated encoded inputs corresponding to the test channels connected to said at least two inputs of said decoding circuit, to a computer simulation of said integrated circuit and said decoding circuit; and (c) generating a test program for said integrated circuit tester from test vectors including said simulated inputs corresponding to said test channels electrically connected to said input pads of said integrated circuit, said simulated encoded inputs corresponding to said test channels connected to said at least two inputs of said decoding circuit, and said simulated outputs corresponding to said test channels electrically connected to said output pads of said integrated circuit and resulting from said computer simulation of said integrated circuit and said decoding circuit.

2. A method for testing an integrated circuit having logic circuitry and an unprogrammed, electrically programmable read-only-memory by an integrated circuit tester, said logic circuitry and said electrically programmable read-only-memory being responsive to HIGH and LOW logic level voltages, said electrically programmable read-only-memory requiring a PRO- GRAMMING voltage for programming said read-only-memory, said electrically programmable read-only-memory having a plurality of addresses, said integrated circuit tester having a plurality of test channels, each test channel configured to drive said HIGH and LOW logic level voltages, but not said PROGRAMMING voltage for programming said electrically programmable read-only-memory, comprising the steps of:

(a) selecting one of said plurality of addresses of said electrically programmable read-only-memory for programming;

(b) providing data to said electrically programmable read-only-memory to be programmed into said selected one of said plurality of addresses;

(c) causing a HIGH logic level voltage to be transmitted through a first test channel of said integrated circuit tester;

(d) causing a HIGH logic level voltage to be transmitted through a second test channel of said integrated circuit tester;

(e) receiving said HIGH logic level voltages from said first and second test channels of said integrated circuit tester and generating a first voltage signal equal in amplitude to said HIGH logic level voltage in response thereof;

(f) amplifying said first voltage signal by a gain to generate a first amplified voltage signal equal in amplitude to said PROGRAMMING voltage for programming said read-only-memory; and (g) driving an input to said electrically programmable read-only-memory with said first amplified voltage signal to cause said selected one of said plurality of addresses to be programmed with said provided data.

3. The method as recited in claim 2, further comprising after step (g), the steps of:

(h) causing a LOW logic level voltage to be transmitted through said first test channel of said integrated circuit tester;

(i) causing a HIGH logic level voltage to be transmitted through said second test channel of said integrated circuit tester;

(j) receiving said LOW logic level voltage from said first test channel of said integrated circuit tester and said HIGH logic level voltage from said second test channel of said integrated circuit tester and generating a second voltage signal equal in amplitude to a predetermined fraction of said HIGH logic level voltage in response thereof;

(k) amplifying said second voltage signal by said gain to generate a second amplified voltage signal equal in amplitude to said HIGH logic level voltage; and (l) driving said input to said electrically programmable read-only-memory with said second amplified voltage signal and verifying that said selected one of said plurality of addresses has been programmed.

4. The method as recited in claim 2, said logic portion having a plurality of inputs and outputs, further comprising the steps of:

(a1) connecting each of said plurality of inputs and outputs of said logic portion of said integrated circuit to one of said plurality of test channels of said integrated circuit tester;

(a2) causing a voltage signal equal in amplitude to said LOW logic level voltage to be transmitted through said first test channel of said integrated circuit tester;

(a3) causing a voltage signal equal in amplitude to said LOW logic level voltage to be transmitted through said second test channel of said integrated circuit tester;

(a4) receiving said LOW logic level voltages from said first and second test channels of said integrated circuit tester and generating a third voltage signal equal in amplitude to said LOW logic level voltage in response thereof;

(a5) amplifying said third voltage signal by a gain to generate a third amplified voltage signal equal in amplitude to said LOW logic level voltage;

(a6) causing said integrated circuit tester to generate a predetermined sequence of HIGH and LOW logic level voltages on each of said plurality of inputs of said logic portion of said integrated circuit; and (a7) causing said integrated circuit tester to detect, then compare the voltage levels generated on said outputs of said integrated circuit as a result of said predetermined sequence of HIGH and LOW logic level voltages on each of said plurality of inputs, against expected voltage levels for said outputs, while driving said input to said electrically programmable read-only-memory with said third amplified voltage signal.

5. An integrated circuit test apparatus for testing an integrated circuit having logic circuitry and an unprogrammed, electrically programmable read-only-memory, said integrated circuit having a plurality of inputs and outputs including an input for programming said electrically programmable read-only-memory, comprising:

an integrated circuit tester having a plurality of test channels; and a high voltage signal decoding circuit for receiving two of said plurality of test channels and generating a signal in response thereof to drive said input for programming said electrically programmable read-only-memory.

6. The integrated circuit test apparatus as recited in claim 5, wherein said high voltage signal decoding circuit comprises:

a resistor network including at least two resistors connected in series, said resistor network having two end nodes and an intermediate node, said intermediate node being situated between at least two resistors, said first test channel being connected to one of said two end nodes and said second test channel being connected to the other of said two end nodes; and a voltage amplifier having an input connected to said intermediate node of said resistor network, and an output;

wherein said output of said voltage amplifier is connected to and drives said programming input of said integrated circuit.

7. The integrated circuit test apparatus as recited in claim 5, further comprising encoding means for causing said integrated circuit tester to provide a HIGH logic level voltage on each of said two test channels received by said high voltage signal encoding circuit when said signal driving said input for programming said electrically programmable read-only-memory is to be equal to a programming voltage, or causing said integrated circuit tester to provide a voltage signal corresponding to said HIGH logic level voltage on one of said two test channels and a LOW logic level voltage on the other when said signal driving said input for programming said electrically programmable read-only-memory is to be equal to said HIGH logic level voltage, or causing said integrated circuit tester to provide a voltage signal corresponding to said LOW logic level voltage on each of said two test channels when said signal driving said input for programming said electrically programmable read-only-memory is to be equal to said LOW logic level voltage.

8. The integrated circuit test apparatus as recited in claim 7, wherein said encoding means is a test program being run on said integrated circuit tester.

* * * * *